United States Patent
Xue et al.

(10) Patent No.: US 12,272,944 B2
(45) Date of Patent: Apr. 8, 2025

(54) METHOD FOR PROCESSING INTERPHASE SHORT CIRCUIT OF THREE-PHASE NON-EFFECTIVE GROUNDING POWER SUPPLY SYSTEM

(71) Applicant: BAODING YUXIN ELECTRIC TECHNOLOGY CO., LTD., Hebei (CN)

(72) Inventors: Zhanyu Xue, Hebei (CN); Jinchun Xing, Hebei (CN)

(73) Assignee: BAODING YUXIN ELECTRIC TECHNOLOGY CO., LTD., Hebei (CN)

( * ) Notice: Subject to any disclaimer, the term of this patent is extended or adjusted under 35 U.S.C. 154(b) by 198 days.

(21) Appl. No.: 18/265,814

(22) PCT Filed: Dec. 2, 2021

(86) PCT No.: PCT/CN2021/135187
§ 371 (c)(1),
(2) Date: Jun. 7, 2023

(87) PCT Pub. No.: WO2022/121782
PCT Pub. Date: Jun. 16, 2022

(65) Prior Publication Data
US 2023/0387680 A1    Nov. 30, 2023

(30) Foreign Application Priority Data
Dec. 12, 2020    (CN) .......................... 202011453632.5

(51) Int. Cl.
*H02H 7/00*    (2006.01)
*G01R 31/52*    (2020.01)
(Continued)

(52) U.S. Cl.
CPC .............. *H02H 7/26* (2013.01); *G01R 31/52* (2020.01); *H02H 1/0007* (2013.01)

(58) Field of Classification Search
None
See application file for complete search history.

(56) References Cited

U.S. PATENT DOCUMENTS

| | | | |
|---|---|---|---|
| 2018/0241200 A1* | 8/2018 | Hu | .......................... H02H 3/162 |
| 2020/0044436 A1* | 2/2020 | Alibert | ............. G01R 19/16547 |
| 2022/0109293 A1* | 4/2022 | Meisinger, Sr. | ......... H02H 3/06 |

FOREIGN PATENT DOCUMENTS

| | | |
|---|---|---|
| CN | 1912642 A | 2/2007 |
| CN | 101017974 A | 8/2007 |

(Continued)

OTHER PUBLICATIONS

International Search Report mailed Feb. 28, 2023 in corresponding PCT application No. PCT/CN2021/135187.

*Primary Examiner* — Stephen W Jackson
(74) *Attorney, Agent, or Firm* — Nields, Lemack & Frame, LLC

(57) ABSTRACT

A method for processing an interphase short circuit of a three-phase non-effective grounding power supply system, includes: when a two-phase or three-phase interphase short circuit occurs in a circuit, maintaining a fault phase of the circuit to be conducting and tripping off remaining fault phases, and enabling another fault phase connected to said fault phase to be artificially grounded or directly utilizing an existing grounding point; enabling a charged phase or a neutral point of the three-phase non-effective grounding power supply system other than said fault phase to be cyclically connected to and disconnected from the ground, to form a closed loop together with said fault phase and generate a current pulse, and detecting the current pulse by a controlled switch. When a certain controlled switch (Continued)

reaches a trigger condition and cuts off a circuit, a fault is cleared.

13 Claims, 2 Drawing Sheets

(51) Int. Cl.
*H02H 1/00* (2006.01)
*H02H 7/26* (2006.01)

(56) References Cited

FOREIGN PATENT DOCUMENTS

| | | |
|---|---|---|
| CN | 101673933 A | 3/2010 |
| CN | 103545796 A | 1/2014 |
| CN | 105006810 A | 10/2015 |
| CN | 106771877 A | 5/2017 |
| CN | 113725823 A | 11/2021 |
| JP | 2017-72538 A | 4/2017 |

* cited by examiner

METHOD FOR PROCESSING INTERPHASE SHORT CIRCUIT OF THREE-PHASE NON-EFFECTIVE GROUNDING POWER SUPPLY SYSTEM

CROSS-REFERENCE TO RELATED APPLICATION

This patent application is a national stage of International Application No. PCT/CN2021/135187, filed on Dec. 2, 2021, which claims the benefit of and priority to Chinese Patent Application No. 2020114536325 filed with the China National Intellectual Property Administration on Dec. 12, 2020. Both of the aforementioned applications are incorporated by reference herein in their entireties as part of the present application.

TECHNICAL FIELD

The present disclosure relates to the field of power supply system fault processing, in particular to a method for processing an interphase short circuit fault of a three-phase non-effective grounding power supply system.

BACKGROUND

At present, when an interphase short circuit occurs in a certain circuit of the three-phase non-effective grounding power supply system, the general way to deal with this is as follows. 1. A reclosing method is adopted, where firstly a first circuit breaker on the circuit is cut off and then the first circuit breaker is closed, and if the short circuit is an instantaneous interphase short circuit, and eliminated after the first circuit breaker is closed, then normal power supply is continued. If the interphase short circuit fault still exists after the first circuit breaker is closed, the first circuit breaker is cut off for maintenance. 2. A stage difference coordination method is adopted. That is, for the circuit breakers of the same circuit set different overcurrent tripping time according to respective distances from the power supply, the closer to the power supply, the longer the tripping time is. Generally, the level difference is set to be 100 ms, which is determined by the mechanical action length of time of the switch and the time spent by the algorithm. This method can isolate the fault area, but for the fault whose fault point is close to the power source, the power supply system withstands short-circuit current for a long time, thus the power grid withstands a great impact. 3. The first circuit breaker overflows and firstly trips off, and then the last circuit breaker trips off. If the fault occurs downstream of the last circuit breaker, the fault can be cleared. Otherwise, if the first circuit breaker recloses and there is still a fault current, the first circuit breaker overflows and then trips off, and then the penultimate circuit breaker is cut off. If the interphase short circuit occurs between the penultimate circuit breaker and the last circuit breaker, the fault can be cleared, and in the same manner, the circuit breakers can be cut off in order upward until the fault is cleared. However, during the operational process, the uncut circuit breakers and power supply system are continuously subjected to large short-circuit current impact, which can cause damage to the circuit if the time is too long or the number of times is too large. If the duration of the interphase short circuit cannot exceed 300 milliseconds and the trip time of the circuit breaker is 100 milliseconds, generally it is not advisable to have more than three circuit breakers on a circuit, otherwise the above method may lead to the impact exceeding 300 milliseconds on the circuit. It can be seen that the existing methods for processing interphase short circuit have the disadvantages of being long in consumed time in processing faults and incapable of automatically clearing the faults.

SUMMARY

Technical Problems

The present disclosure aims to provide a method for processing an interphase short circuit of a three-phase non-effective grounding power supply system. The method can quickly position an interphase short circuit fault point section and can automatically, quickly and accurately clear a fault, well improving the processing quality for the interphase short circuit fault, and improving the power supply safety.

Solutions of Problems

Technical Solutions

In order to achieve the above purpose, the present disclosure adopts the following technical scheme: a method for processing an interphase short circuit of a three-phase non-effective grounding power supply system, on the three-phase non-effective grounding system distributed a plurality of controlled switches, which can detect a current pulse and cut off a circuit according to a number of current pulses; when a simple two-phase or three-phase interphase short circuit occurs in a circuit, the following method (a) is used, comprising the following steps: maintaining a fault phase of the circuit to be turned on and tripping off the remaining fault phases, and enabling another fault phase connected to the fault phase to be artificially grounded; then, enabling a charged phase or a neutral point of the three-phase non-effective grounding power supply system other than the fault phase to be cyclically connected to and disconnected from the ground, to form a closed loop together with the fault phase and generate a current pulse, where a number of current pulses that triggers the controlled switches downstream of a power source to cut off is set to be smaller than that of current pulses that triggers the controlled switches upstream of the power source to cut off, and when a certain controlled switch reaches a trigger condition and cuts off a circuit, stopping the another fault phase from being grounded, and stopping the charged phase or the neutral point from being connected to the ground; and when a two-phase or three-phase interphase short circuit with a ground fault occurs in a circuit, the method (a) is used, or the following method (b) is used, comprising the following steps: maintaining a fault phase of the circuit to be turned on and tripping off the remaining fault phases; then, enabling a charged phase of the power supply system other than the fault phase to be cyclically connected to and disconnected from the ground, to form a closed loop together with the fault phase and generate a current pulse, where the number of current pulses that triggers the controlled switches downstream of a power source to cut off is set to be smaller than that of current pulses that triggers the controlled switches upstream of the power source to cut off, and when a certain controlled switch reaches a trigger condition and cuts off a circuit, stopping the charged phase or the neutral point from being grounded.

Preferably, in the method (a) and the method (b), the step of maintaining the fault phase to be turned on may comprise firstly tripping off the fault phase and then turning on the fault phase, and not tripping off the fault phase.

Preferably, the method (a) comprises firstly tripping off a first circuit breaker of the circuit, shorting the fault phase across the first circuit breaker by a first switch so as to turn on the fault phase, wherein the first switch is the controlled switch, artificially grounding the other fault phase at a downstream port of the first circuit breaker through a third switch, cyclically connecting and disconnecting the charged phase to and from the ground at an upstream port of the first circuit breaker, or cyclically connecting and disconnecting the system neutral point to and from the ground through a second switch to form the closed loop with the fault phase and generate the current pulse, opening the first switch and the third switch and stopping the second switch from being grounded, after the certain controlled switch reaches the trigger condition and cuts off the circuit, and then closing the first circuit breaker.

Preferably, the method (b) comprises firstly tripping off a first circuit breaker of the circuit, shorting the fault phase across the first circuit breaker by a first switch so as to conduct the fault phase, wherein the first switch is the controlled switch, cyclically connecting and disconnecting the charged phase to and from the ground at an upstream port of the first circuit breaker, or cyclically connecting and disconnecting the system neutral point to and from the ground through a second switch to form the closed loop with the fault phase and generate the current pulse, and opening the first switch and stopping the second switch from being grounded, and then closing the first circuit breaker, after the certain controlled switch reaches the trigger condition and cuts off the circuit.

Preferably, the second switch is an electronic power switch.

Preferably, the electronic power switch is an insulated gate bipolar transistor.

Preferably, the method further comprises signaling the second switch to stop the second switch from connecting to the ground, when the controlled switch reaches the trigger condition and cuts off the circuit.

Preferably, the controlled switch is capable of cutting off the circuit in time according to the number of current pulses to avoid a next current pulse from passing through.

Preferably, in the method (b), connecting to the ground is performed when a voltage phase angle is zero degree if a resistance of the closed loop is relatively small, to obtain a current pulse with a relatively small peak value, or connecting to the ground is performed when a voltage phase angle is 90 degree if a resistance of the closed loop is relatively large, to obtain a current pulse with a relatively large peak value.

Preferably, the method further comprises monitoring magnitudes of the current pulses, and cutting off the second switch to complete a pulse action when an instantaneous value of the current pulse reaches a preset value, to control a peak value of each current pulse not to exceed the preset value.

Preferably, in the method (a) and the method (b), a current limiting resistor is connected in series in the closed loop.

Preferably, an adjustable resistor is connected in series between the second switch and the ground.

Beneficial Effects of the Disclosure

Beneficial Effects

The present disclosure has the beneficial effects that after the interphase short circuit fault occurs, firstly, the original fault current is cut off, and a current pulse is artificially formed and flows through all the original fault loops or a new loop of part of the fault loops and is used for fault analysis. Specifically, a fault phase is formed to be grounded in a single-phase manner, and another fault phase (two phases short circuited) is disconnected or the third phase (three phases short circuited) is disconnected at the same time. Then, the charged phase or neutral point of the power supply system is cyclically connected to and disconnected from the ground, to form a closed loop with the grounded fault phase and generate a current pulse. The current pulse is detected by the controlled switch on the fault phase and cut off after the controlled switch reaches the trigger condition. Since the number of current pulses that triggers the controlled switch downstream of the power source to cut off is less than the number of current pulses that triggers the controlled switch upstream of the power source to cut off, and the controlled switches located downstream the fault point of the interphase short circuit in the fault phase cannot enter into the closed loop, and no current pulse flows through those controlled switches, therefore, the first controlled switch upstream of the fault point of interphase short circuit must be cut off firstly, thus clearing the interphase short circuit fault. In view of the above situation, if the interphase short circuit is attached with single-phase grounding, the grounding point can be directly used, or the artificially formed grounding point can be used. If the interphase short circuit is a simple interphase short circuit, the grounding point must be artificially formed. That is, it is preferable to form a grounding point on another fault phase through the third switch. The grounding point is preferably located at the downstream port of the first circuit breaker, or at other positions of the another fault phase, especially when located upstream of the interphase short circuit point, the controlled switch on the other fault phase should be correspondingly arranged so as not to detect current pulses of the phase, so as not to be cut off earlier than the controlled switch expected to be cut off. According to the method, the interphase fault is converted into a single-phase ground fault to be dealt with, and the controlled switch can automatically trip off so as to clear the fault quickly, accurately and automatically, and then the other fault phase can be stopped from being grounded, the charged phase is stopped from being cyclically grounded, and finally the first circuit breaker is closed to restore power supply.

BRIEF DESCRIPTION OF THE DRAWINGS

Description of the Drawings

Figure 1:
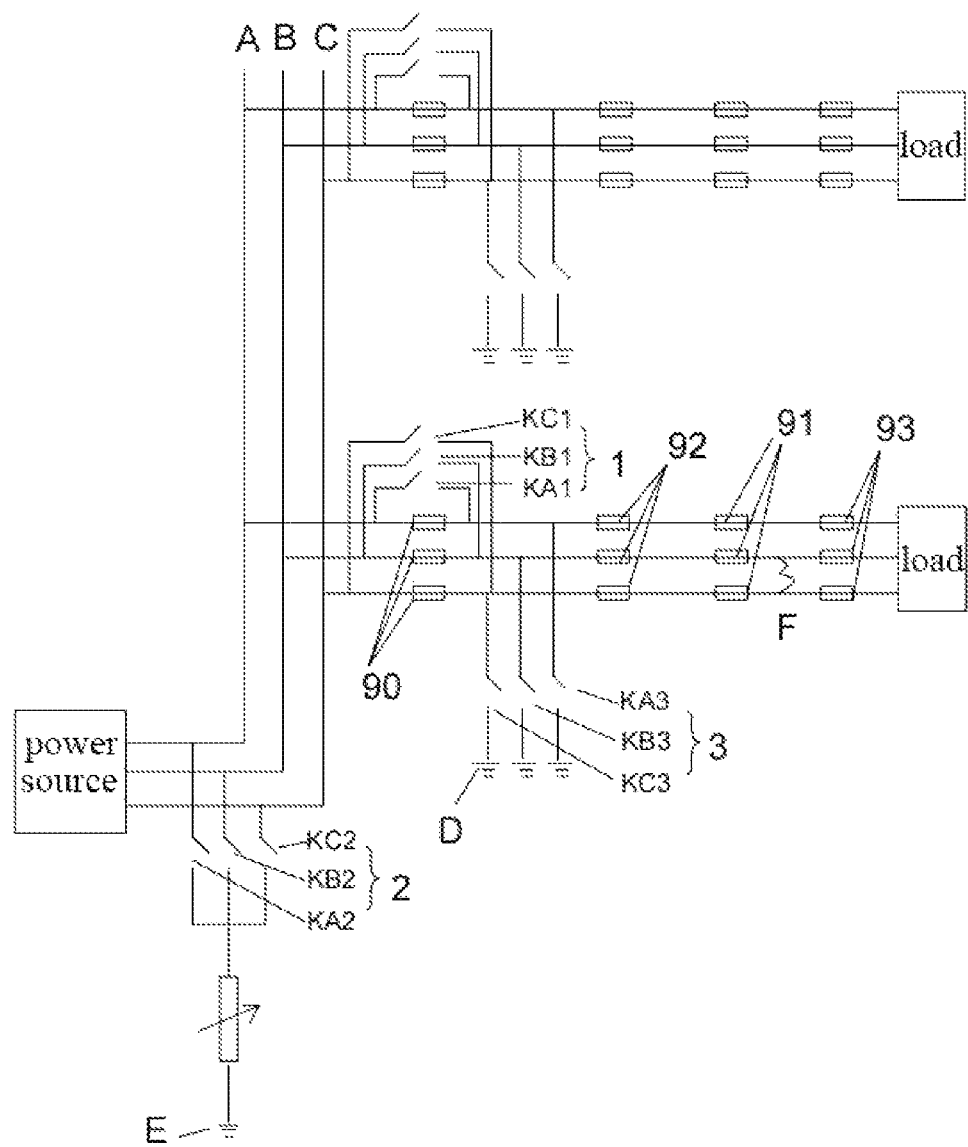
Figure 2:
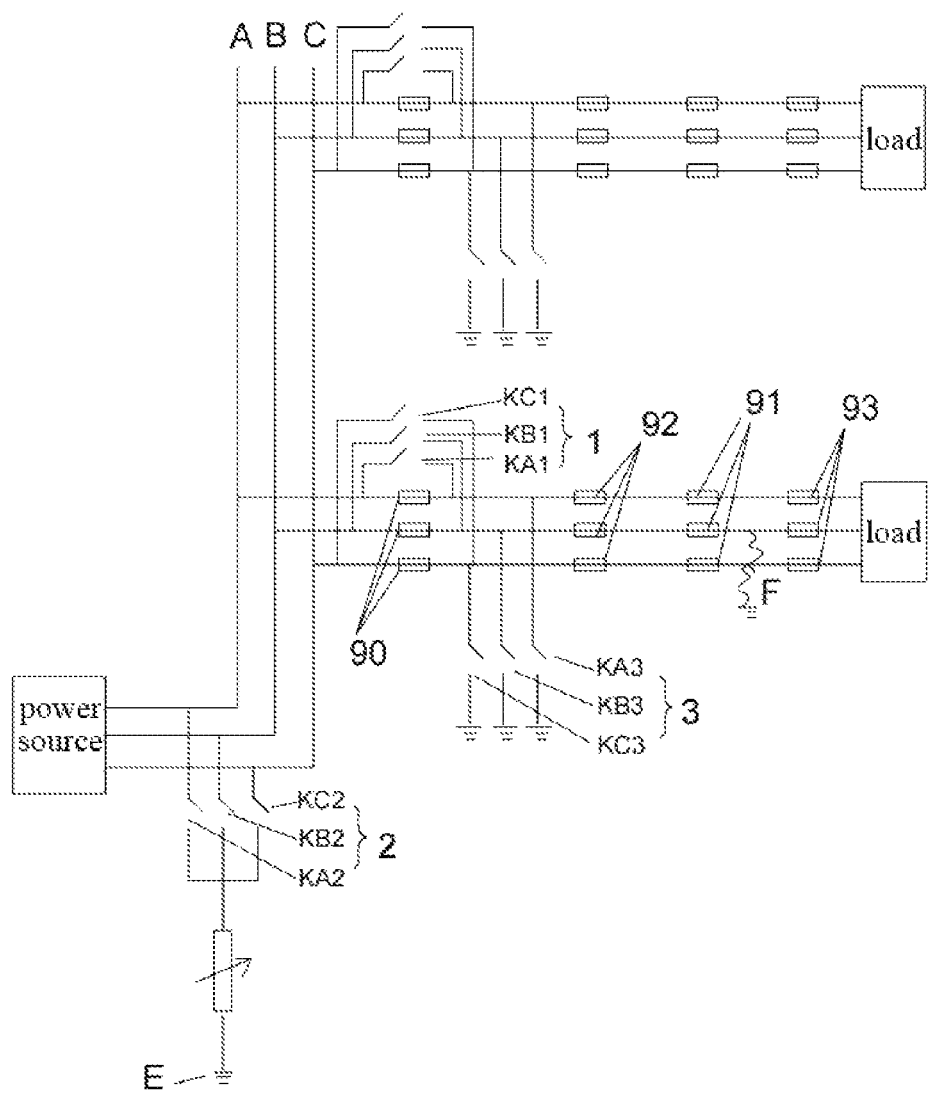

FIG. 1 is a wiring schematic diagram of one embodiment of the method according to the disclosure; and FIG. 2 is a wiring schematic diagram of another embodiment of the method according to the disclosure.

DETAILED DESCRIPTION OF THE EMBODIMENTS

Embodiments of the Present Disclosure

With reference to the attached figures, the present disclosure is further explained by specific embodiments. The three-phase power supply system is a common non-effective grounding system. Generally multiple outgoing lines are arranged on the bus of the three-phase power supply system. Each outgoing line is provided with a plurality of controlled switches. The controlled switches can detect the current pulses on one phase, two phases or three phases of a circuit according to settings, and can be configured to cut off the three-phase circuit when the number of current pulses passing through any phase reaches a preset value. In one specific embodiment with respect to the controlled switch, the controlled switch includes a control unit, a current detecting unit and an execution unit. The current detecting unit can respectively detect the current of each phase of the three phase circuit. The control unit compares the number of current pulses detected by the current detecting unit with a preset value, and can be configured to signal the execution unit to cut off the three phase circuit when the number of current pulses passing through any phase reaches the preset value. For the preset value of the number of current pulses that triggers cutting off, the preset value of the controlled switch located downstream of a power source direction is smaller than the preset value of the controlled switch located upstream of the power source direction. The wording upstream of the power source direction means relatively closer to the power source, and the wording downstream of the power source direction means relatively farther away from the power source, that is, electric energy is generated from the power source and transmitted from upstream to downstream. In other words, according to the upstream and downstream direction of the power source direction, the controlled switches farther away from the power source has smaller preset values that trigger cutting off, easier to reach a trigger condition to cut off. In practice, circuit breakers arranged on each outgoing line can detect the number of current pulses flowing through the circuit breaker, and it can be configured that the circuit is cut off when certain number of current pulses pass through one phase or several phases, thus the circuit breaker can be regarded as a controlled switch.

As shown in FIG. 1, in one specific embodiment, a first circuit breaker 90 is arranged on respective outgoing lines in phase A, phase B and phase C near the bus. A first switch 1 is equipped across the first circuit breaker 90. The first switch 1 includes three switches KA1, KB1 and KC1 equipped on the phase A, phase B and phase C. The first switch is a controlled switch. That is, the switches KA1, KB1 and KC1 can cut off according to a preset number of current pulses. The first switch 1 can short a certain phase across the first circuit breaker 90 (for example, after the first circuit breaker 90 cuts off the circuit, the switch KA1 in the first switch 1 is closed, to short phase A, so that phase A may conduct again bypassing the first circuit breaker 90). In this way, even if the first circuit breaker is cut off, the shorted phase is still conducting and charged (of course, the first circuit breaker may be kept uncut for one phase from the beginning, thus the one phase may be charged from the beginning without short circuiting by the first switch). A plurality of circuit breakers are arranged downstream of the first circuit breaker 90 (these circuit breakers downstream of the first circuit breaker can be regarded as controlled switches). Each circuit breaker can cut off the three-phase circuit according to the number of current pulses in a certain phase. A third switch 3 is installed at the downstream port of the first circuit breaker 90 of each outgoing line. Three switches KA3, KB3 and KC3 of the third switch 3 can respectively enable the phase A, phase B and phase C to be connected to the ground, so that any phase can be grounded. And, a second switch 2 is also equipped on the bus (namely, the second switch 2 is located at the upstream port of the first circuit breaker 90, or is equipped between the system neutral point and the ground, and in this case, only one phase switch is needed). Three switches KA2, KB2 and KC2 in the second switch 2 can respectively enable the three phases of the bus to be connected to and disconnected from the ground. If a simple interphase short circuit (such as short circuit between the phase B and the phase C or three phase short circuit) occurs at point F, firstly, the first circuit breaker 90 trips off to cut off the three-phase circuit, then one switch in the first switch 1 is closed to make a fault phase (such as phase B, in this case switch KB1 is closed) conducted and charged, and then at the lower port of the first circuit breaker 90 one switch in the third switches 3 is used to make another fault phase (such as phase C, and in this case the switch KC3 is closed) connected to the ground at point D. In this way, for phase B of the circuit, from the short circuit point F to phase C and then to grounding point D, single-phase grounding is formed. Then, through one switch KA2 of the second switches, phase A (at this time, phase A is a charged phase) is cyclically connected to and disconnected from the ground at the upstream port of the first circuit breaker, thus repeatedly generating current pulses (or phase C is cyclically connected to and disconnected from the ground by using the switch KC2, also capable of forming a closed loop and generating current pulses), which flow through the fault phase B through the grounding point E of the second switch, the grounding point D of the third switch and the interphase short circuit point F. When the number of current pulses reaches the trigger condition of the closest controlled switch 91 upstream of the interphase short circuit point F, the controlled switch 91 cuts off the circuit, thereby excluding the interphase short circuit point F from the system (the trigger condition of the higher upstream controlled switch 92 is not reached yet at this time, so the controlled switch 92 will not cut off; and the controlled switch 93 downstream of the interphase short circuit point in phase B do not operate because no current pulse flows through it). Then switch KB1 on the first switch 1 is disconnected, KC3 in the third switch 3 is stopped from being grounded, KA2 in the second switch is stopped from being cyclically grounded, and the first circuit breaker 90 is finally closed to restore power supply for the circuit.

In one embodiment, the first circuit breaker can separately control three phases and has the function of a controlled switch. The first circuit breaker can be directly used for keeping a fault phase conducting and jumping off other fault phases. And, the number of current pulses that triggers the first circuit breaker to cut off can be set to the maximum (namely, more than that of the second circuit breaker). If the circuit breaker (used as a controlled switch) downstream of the first circuit breaker does not trip off, it means that the interphase short circuit occurs between the first circuit breaker and the second circuit breaker. According to a set trigger condition, the first circuit breaker will trip off, thus isolating the fault.

As shown in FIG. 2, in another specific embodiment, if an interphase short circuit occurs at point F with grounding at the short circuit point, an artificial grounding point can still be formed by using the third switch in the above method, and then a current pulse can be generated through the second switch, namely, the above method is still applicable. In the case of also having ground fault, there is another method: firstly, the first circuit breaker 90 trips off to cut off the three-phase circuit, and then switch KB1 of the first switch is closed, single-phase grounding is formed by directly using the grounding point at the short circuit point, and then, phase A (or phase C) is cyclically connected to and disconnected from the ground at the upstream port of the first circuit breaker through the second switch, thus repeatedly generating current pulses, which flow through the fault phase B through the grounding point E of the second switch and the grounding point F at the interphase short circuit point, and when the number of current pulses reaches the trigger condition of the closest controlled switch 91 upstream of the interphase short circuit point, the controlled switch 91 cuts off the circuit, thus excluding the interphase short circuit point F from the system. Then, switch KB1 of the first switch is disconnected, the second switch 2 is stopped from cyclically grounding the charged phase, and the first circuit breaker 90 is closed to restore the power supply for the circuit.

In the embodiment, the relationship among the trip time of the controlled switch, the time of the current pulse and the time interval of two consecutive current pulses can be adjusted, so that the trip time of the controlled switch when reaching the trigger condition is timely, avoiding the next current pulse to flow through, thereby avoiding tripping operation of the higher upstream controlled switch. It is ensured that before the next current pulse is emitted, if a controlled switch reaches its cut-off condition, it will trip off to cut off, avoiding a case where the controlled switch does not trip off timely and multiple current pulses are emitted, resulting unexpected tripping off of controlled switch(es) upstream of the controlled switch supposed to trip off, which causes unreasonable large-area power outage. For the case where three-phase short circuit with grounding occurs at the interphase short circuit point, the above processing method can also clear faults.

In one specific embodiment, a short period of cyclical grounding and disconnection is achieved by using an electronic power switch, such as an insulated gate bipolar transistor. At present, the insulated gate bipolar transistor can withstand high-power connection and disconnection, and has microsecond level response time, which enables formation of several short-circuit current pulses with duration of milliseconds.

For single-phase grounding formed by the third switch, because of small grounding resistance, short-circuit current pulses would be large and may even cause damage to power source equipment and trigger first section, second section overcurrent protection of the three-phase system, resulting in large-scale power outage. In order to avoid this possibility, by using the instant on-off performance of the electronic power switch, a current detection device can be arranged to detect the instantaneous value of the current pulse. The circuit can be cut off in time when the instantaneous value of the current pulse is too large and exceeds the preset value, thus avoiding from triggering overcurrent protection. Alternatively, a suitable current limiting resistor can be connected in series in advance, such as an adjustable resistor connected in series between the second switch and the ground. In addition, for the case where interphase short circuit point also has grounding, when the grounding resistance is small, the electronic power switch can be arranged to be conducting at a zero voltage phase angle, so that excitation current cannot be generated, avoiding increasing the short-circuit current, enabling the peak value of the current pulse to be relatively small. When the grounding resistance is large, the electronic power switch can be conducting at a 90-degree voltage phase angle, so that excitation current can be generated, increasing the peak value of short-circuit current, facilitating detection. The magnitudes of grounded short-circuit loop resistance and short-circuit current are analyzed and determined according to the specific detection environment, which is mastered by those skilled in the art. When the resistance of the short-circuit loop is so large that the short-circuit current is too small for easy detection, the switch should be closed near a 90-degree voltage phase angle to increase the current and improve the detection rate. When the resistance of the grounded short-circuit loop is so small that the current is excessively large to burn down the equipment possibly, the switch can be cut off in time when the instantaneous value of the current pulse reaches the preset value, or can be closed when the voltage phase angle is zero, to avoid from increasing the current, accompanied with current monitoring.

The above embodiments are merely description of concept and implementations of the innovation and are not limiting, and under the concept of the innovation, technical schemes that are not substantially changed are still within the scope of protection.

INDUSTRIAL PRACTICABILITY

In the experiment in the three-phase power supply system, the above method is completely applicable.

What is claimed is:

1. A method for processing an interphase short circuit of a three-phase non-effective grounding power supply system, wherein a plurality of controlled switches are distributed on the three-phase non-effective grounding system, and the controlled switches are capable of detecting current pulses and cutting off a circuit according to a number of the current pulses;

when a simple two-phase or three-phase interphase short circuit occurs in a circuit, a following method (a) is used, comprising following steps:

(a) maintaining a fault phase of the circuit to be conducting and tripping off remaining fault phases, and artificially grounding another fault phase connected to the fault phase; cyclically connecting and disconnecting a neutral point or a charged phase of the three-phase non-effective grounding power supply system other than the fault phase to and from the ground, to form a closed loop with the fault phase and generate current pulses, wherein a number of current pulses that triggers controlled switches at downstream of a power source to cut off is set to be smaller than that of current pulses that triggers controlled switches at upstream of the power source to cut off, and stopping the another fault phase from grounding, and stopping the charged phase or the neutral point from being connected to the ground, when a certain controlled switch reaches a trigger condition and cuts off the circuit; and when a two-phase or three-phase interphase short circuit with a grounding fault occurs in a circuit, the method (a) is used, or a following method (b) is used, comprising the following steps:

(b) maintaining a fault phase of the circuit to be conducting and tripping off remaining fault phases; cyclically connecting and disconnecting a neutral point or a charged phase of the three-phase non-effective grounding power supply system other than the fault phase to and from the ground, to form a closed loop together with the fault phase and generate current pulses, wherein a number of current pulses that triggers controlled switches at downstream of a power source to cut off is set to be smaller than that of current pulses that triggers controlled switches at upstream of the power source to cut off, and stopping the charged phase or the neutral point from being connected to the ground when a certain controlled switch reaches a trigger condition and cuts off the circuit.

2. The method according to claim 1, wherein in the method (a) and the method (b), the maintaining a fault phase to be conducting comprises firstly tripping off the fault phase and then conducting the fault phase, and not tripping off the fault phase.

3. The method according to claim 1, the method (a) comprises firstly tripping off a first circuit breaker of the circuit, shorting the fault phase across the first circuit breaker by a first switch so as to conduct the fault phase, wherein the first switch is a controlled switch, artificially grounding the another fault phase at a downstream port of the first circuit breaker through cyclically a third switch, connecting and disconnecting the charged phase to and from the ground at an upstream port of the first circuit breaker or cyclically connecting and disconnecting the neutral point to and from the ground through a second switch to form the closed loop with the fault phase and generate the current pulses, opening the first switch and the third switch and stopping the second switch from being grounded, and then closing the first circuit breaker, after the certain controlled switch reaches the trigger condition and cuts off the circuit.

4. The method according to claim 3, further comprising signaling the second switch to stop the second switch from being connected to the ground, when the controlled switch reaches the trigger condition and cuts off the circuit.

5. The method according to claim 3, further comprising monitoring magnitudes of the current pulses, and cutting off the second switch to complete a pulse action when an instantaneous value of the current pulse reaches a preset value, to control a peak value of each current pulse not to exceed the preset value.

6. The method according to claim 3, wherein an adjustable resistor is connected in series between the second switch and the ground.

7. The method according to claim 1, wherein the method (b) comprises: firstly, tripping off a first circuit breaker of the circuit, shorting the fault phase across the first circuit breaker by a first switch so as to conduct the fault phase, wherein the first switch is a controlled switch, cyclically connecting and disconnecting the charged phase to and from the ground at an upstream port of the first circuit breaker, or cyclically connecting and disconnecting the neutral point to and from the ground through a second switch to form the closed loop with the fault phase and generate the current pulses, and opening the first switch and stopping the second switch from being grounded, and then closing the first circuit breaker, after the certain controlled switch reaches the trigger condition and cuts off the circuit.

8. The method according to claim 7, further comprising signaling the second switch to stop the second switch from being connected to the ground, when the controlled switch reaches the trigger condition and cuts off the circuit.

9. The method according to claim 7, further comprising monitoring magnitudes of the current pulses, and cutting off the second switch to complete a pulse action when an instantaneous value of the current pulse reaches a preset value, to control a peak value of each current pulse not to exceed the preset value.

10. The method according to claim 7, wherein an adjustable resistor is connected in series between the second switch and the ground.

11. The method according to claim 1, wherein the controlled switch is capable of cutting off the circuit in time according to the number of current pulses to avoid a next current pulse from passing through.

12. The method according to claim 1, wherein in the method (b), connecting to the ground is performed when a voltage phase angle is zero degree in a case that a resistance of the closed loop is relatively small, to obtain a current pulse with a relatively small peak value, or connecting to the ground is performed when a voltage phase angle is 90 degree in a case that a resistance of the closed loop is relatively large, to obtain a current pulse with a relatively large peak value.

13. The method according to claim 1, wherein in the method (a) and the method (b), a current limiting resistor is connected in series in the closed loop.

* * * * *